US006587815B1

(12) United States Patent
Aingaran et al.

(10) Patent No.: US 6,587,815 B1
(45) Date of Patent: Jul. 1, 2003

(54) WINDOWING SCHEME FOR ANALYZING NOISE FROM MULTIPLE SOURCES

(75) Inventors: Kathirgamar Aingaran, Sunnyvale, CA (US); Manjunath D. Haritsa, San Jose, CA (US); Lakshminarasimhan Varadadesikan, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/498,182

(22) Filed: Feb. 4, 2000

(51) Int. Cl.[7] .............................................. G06F 17/50
(52) U.S. Cl. ............................ 703/13; 703/15; 703/14; 716/10; 716/5; 716/6; 716/2
(58) Field of Search .............................. 703/15, 14, 13; 716/10, 5, 6, 2

(56) References Cited

U.S. PATENT DOCUMENTS

| 5,481,695 | A | * | 1/1996 | Purks | 703/15 |
|---|---|---|---|---|---|
| 5,521,837 | A | * | 5/1996 | Frankle et al. | 716/10 |
| 5,596,506 | A | * | 1/1997 | Petschauer et al. | 716/6 |
| 5,999,714 | A | * | 12/1999 | Conn et al. | 716/2 |
| 6,029,117 | A | * | 2/2000 | Devgan | 702/58 |
| 6,041,169 | A | * | 3/2000 | Brennan | 716/6 |
| 6,128,769 | A | * | 10/2000 | Carlson et al. | 716/6 |
| 6,279,142 | B1 | * | 8/2001 | Bowen et al. | 716/5 |

OTHER PUBLICATIONS

"Statistical Method of Noise Estimation in a Synchronous System", D. Rude, IEEE Transaction on Components, Packaging, an Manufacturing Technology—Part B, vol. 17, No. 4, Nov. 1994.*
"S–Parameter Based Technique for Simultaneous Switching Noise Analysis in Electronic Packages" Z. Jin, IEEE Transactions on Advanced Packaging, vol. 22, No. 3, Aug. 1999.*
"Substrate Coupling Evaluation in BiCMOS Technology" J. Casalta, IEEE Journal of Solid State Circutic, vol. 32, No. 4, Apr. 1997.*
"Miller and Noise Effects in a Synchronizing Flip–Flop", C. Dike, IEEE Journal of Solid State Circuits, vol. 34, No. 6, Jun. 1999.*

* cited by examiner

Primary Examiner—W. Thomson
Assistant Examiner—Fred Ferris
(74) Attorney, Agent, or Firm—Martine & Penilla, LLP

(57) ABSTRACT

Method and apparatus for detecting and analyzing effects of noise in a digital circuit that arises from a coupling of signals produced by switching of a first gate and a second gate in a timed relationship. Where each of a first gate and a second gate can switch within a selected switching time interval, the gate switching effects are combined and the second gate output signal is analyzed with reference to the first gate input signal. Otherwise, the gate switching effects are not combined. When the second gate output signal satisfies at least one of three criteria, this condition is interpreted as indicating that the second gate permits propagation of a noise pulse produced at the first gate.

35 Claims, 6 Drawing Sheets

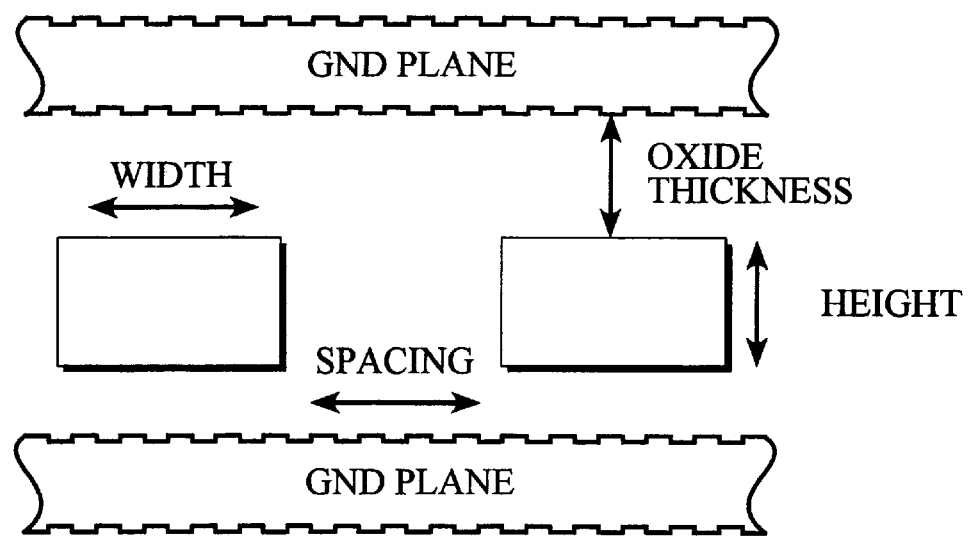
Fig. 1A
PRIOR ART
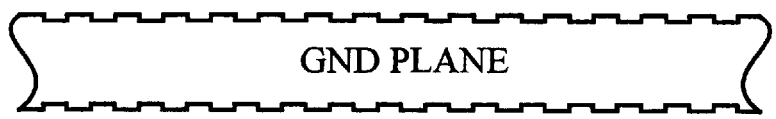
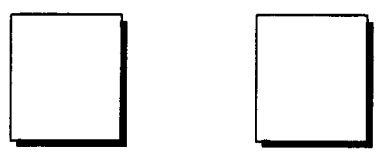
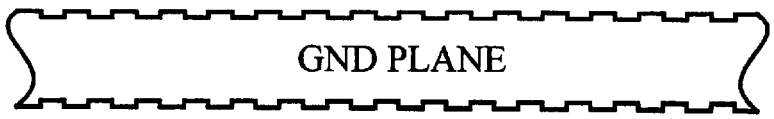
Fig. 1B
PRIOR ART

WINDOWING SCHEME FOR ANALYZING NOISE FROM MULTIPLE SOURCES

FIELD OF THE INVENTION

This invention relates to detection of, and compensation for, noise in large digital circuits.

BACKGROUND OF THE INVENTION

The scaling of transistor size in digital integrated circuits has also led to the shrinking of wire or circuit trace dimensions. A proportionate scaling of wire heights will produce a proportionate increase in wire resistance to electrical current. To avoid this problem, the reduction scale factor for wire height has often been larger (closer to 1) than the scale factor for a horizontal dimension. This has produced wire aspect ratio changes, as illustrated in FIG. 1A (before scale change) and FIG. 1B (after scale change). Further, the spacing distance d between adjacent wires is also reduced by a scaling factor. All these results contribute to an increase in capacitive coupling to adjacent wires and to a decrease in capacitive coupling to so-called quiet planes located above and below the wires. Further, shrinking of the vertical dimension of a wire, although not as pronounced as shrinking in other directions, increases wire resistance and makes the problem of circuit noise worse.

Increases in coupling coefficients and wire resistances contribute to production of much larger noise voltages in deep sub-micron designs than was present in previous generations of semiconductor devices. These voltages typically push a digital gate into the amplifying region of its transfer characteristic, turning a traditionally noise rejecting gate into a noise amplifying stage. Induced noise voltages can create several different problems on chip. Of these, one is most concerned with detection of faulty logic transitions that are triggered by noise, especially irrevocable logic transitions, such as the firing of a precharged gate or the corruption of the data in a storage element.

Noise problems typically depend upon the data set, the testing frequency and process variations. Larger test vector sets are needed to increase the probability that the chip encounters a condition where the effect of coupling noise can be observed. Values for noise voltages and spikes cannot be easily measured on silicon, because the introduction of a probe to a given net dramatically alters its coupling coefficient and also alters the magnitude of the noise induced in the net. As such, noise related problems are not easily reproducible and are extremely difficult to debug, or even to identify as a noise effect, because all other probable causes must first be ruled out. A significantly higher cost in time and money is paid for debugging noise induced problems.

A good noise detection methodology must ensure that a large and complex chip such as a modern microprocessor, can be produced and tested without adding significant delay or cost to the noise detection or noise debugging steps.

What is needed is a method for efficiently and quickly analyzing the results of noise in a large digital circuit and for determining and applying limits on voltage noise amplitude, below which a noise pulse will not propagate from one module to another module on a network.

SUMMARY OF THE INVENTION

These needs are met by the invention, which provides two criteria for confining the effects of generation of a noise pulse, based on tests that characterize the response of different classes of transistors to noise pulses of varying pulse magnitudes. The invention also provides a software noise analysis tool, "noisetool", that detects large coupling noise voltages induced in a microprocessor chip. The following noise detection criterion is adopted: a noise pulse should not propagate through an amplifying stage, and all noise induced at any site on a net should be induced only by aggressor signals at nearest neighbor sites, not by any preceding logic stages.

The noisetool uses a layout parasitic extracted netlist as a starting point and performs flat file and/or hierarchical analyses. All interconnect parasitic elements, usually capacitive and resistive elements, are read from this netlist. In a flat file analysis, the gate and diffusion capacitances of the transistors are calculated based on the transistor models adopted and on transistor sizing information contained in the netlist. Because a bias-independent linear resistance is assumed for the transistor associated with the "victim" line, this resistance is computed based on the device parameters. When a hierarchical analysis is performed, the capacitive loading and/or drive resistance of the sub-circuit ports are preferably obtained from characterized data files.

Where each of two or more aggressor gates can produce a transition signal whose transition time is within a selected switching time interval, determined with reference to a subsequent time a victim gate switches, the combined effects of all such aggressor signals are included in determining if a circuit permits noise pulse propagation. The invention covers situations where two or more aggressor gates may fire at separate and independent times within the switching time interval and the situation where the aggressor gates fire substantially simultaneously.

BRIEF DESCRIPTION OF THE INVENTION

FIGS. 1A and 1B are send views comparing cross sections of signal wires in a preceding and in the present generation.

FIG. 5 shows a computer system usable with the invention.

DESCRIPTION OF THE INVENTION

Noise on any given net in a chip can have one or more of the following effects: (1) data loss and data metastablity in latches, flipflops or other storage elements; (2) faulty logic transitions; (3) speed degradation, leading to setup time violations (or speed increase, leading to hold time violations) due to the Miller effect, when the aggressor component and the victim component are both switching; (4) substrate bounce due to current injection into the substrate, when volume excursions due to noise are above or below the supply level; and (5) extra power dissipation due to propagated signal glitches.

Of these effects, one is most concerned with preventing data loss in latches and flipflops, because functionality is the first priority. The effects of noise coupling on power can be ignored in a speed-demon approach, while the speed decrease/increase effects can be taken into account by most timing tools and by designing the underlying circuits accordingly. In short, the most crucial requirement of a good noise detection strategy is that the strategy should prevent data loss in storage elements and prevent data corruption due to faulty logic transitions.

Figure 2A:
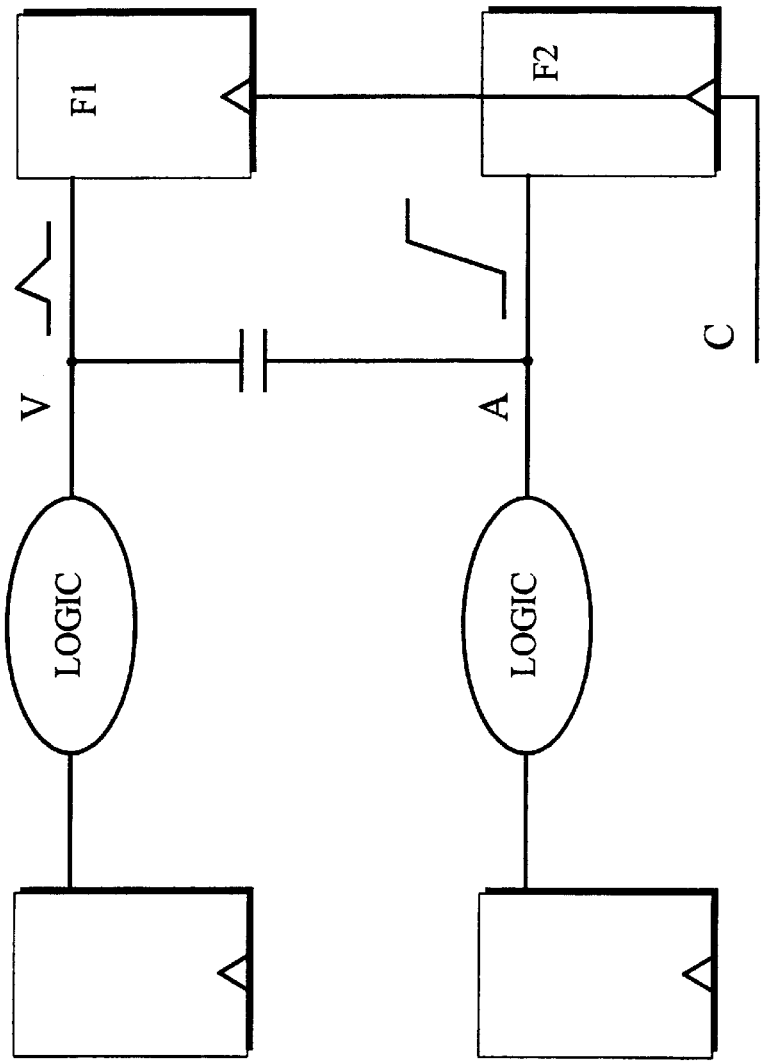
FIGS. 2A and 2B are schematic view illustrating the effects of frequency dependent and frequency independent noise.

The problem of storage of incorrect data in storage elements can be divided into two categories, namely, frequency dependent noise and frequency independent noise. Consider the flipflop F1 in FIG. 2A, where coupling noise is injected from a neighboring line to the flipflop input. Assuming that the aggressor signal A changes just before the rising edge of the clock signal C, the noise pulse on the victim V occurs during the sampling period of the flipflop F1. This results in an incorrect value being stored in F1. However, if the frequency were to be lowered, the aggressor signal A would arrive early relative to C, and the noise pulse on V will occur well outside the sampling period of F1; the signal V has recovered by the time the flipflop F1 samples this signal. This response is referred to as frequency dependent noise, because the effect diminishes or disappears with a lowering of frequency. As such, this response may be viewed purely as a speed problem.

Figure 2B:
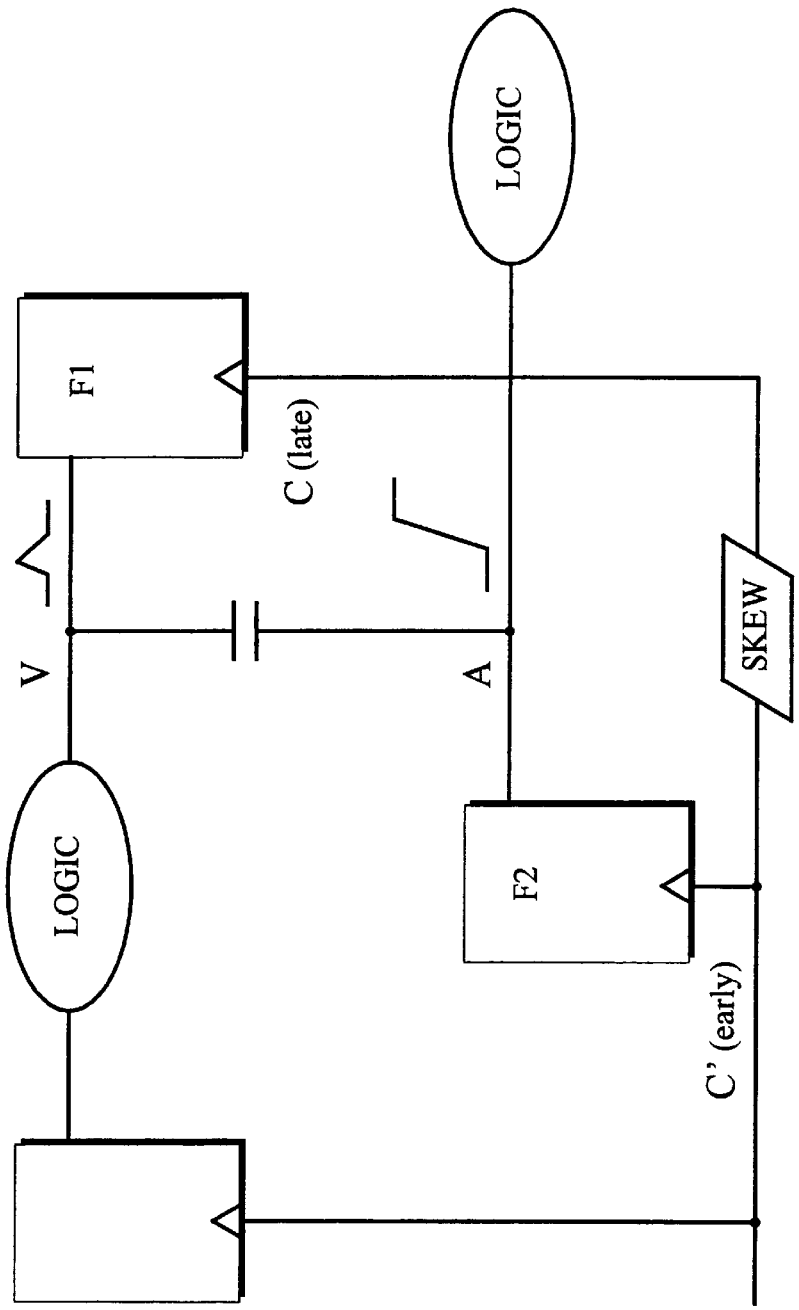

With reference to the flipflop F2 in FIG. 2B, the noise pulse is now caused by coupling with the output of F2 which is assumed to receive an early (skewed) clock pulse C'. It is now possible that the noise pulse impressed by the action of the aggressor signal A on the victim signal V occurs during the sampling period of F2. Because the aggressor signal A moves with the rising clock edge, no matter how much the frequency is reduced, the noise pulse will always occur during the sampling period of F2, and thus will result in an incorrect value being stored in the flipflop F2. This response is an example of frequency independent noise. This response does not change with the frequency of operation and is similar to a race-through condition between two consecutive flipflops. Noise on a dynamic gate that results in the firing of the victim gate may also be characterized as frequency independent noise, because a dynamic gate cannot recover from a wrong transition, even if the operating frequency is reduced.

To guarantee functionality, a noise detection strategy should ensure that all frequency independent noise sources are identified and dealt with. A minimum requirement is that the chip should be guaranteed to work at some frequency. All frequency independent noise effects have to be analyzed, and the affected nets must be checked against one or more pass criteria. This is a very loose limit; the emphasis in most circuits today is on performance. A more reasonable criterion is that the strategy should guarantee that the chip will work at a target frequency and at all lower frequencies. Whatever scheme is used must detect or identify the frequency independent and the frequency dependent noise problems that are likely to cause functional failure at the target frequency.

A third, even stricter, criterion, which may also be applied in a conservative design, is to prevent all faulty logic transitions. By this strategy one should guarantee that noise does not propagate through an amplifying stage so that the noise on each net is a function only of the net and of its neighbors, independent of the noise induced in earlier logic stages. Here, the analysis of noise effects is made considerably easier. The disadvantage of this strategy is that it does not allow for a scenario where a noise pulse created in the middle of the cycle dies out by the end, before the line voltage is sampled. Thus, some pessimism is built into the analysis when compared to the work-at-target approach discussed in the preceding.

In addition, a good noise detection methodology should allow for a sensitivity analysis on the circuit parameters. This enables designers to run what-if analyses on suspect wires during design and redesign. This is best facilitated by a simple analytical model, the parameters of which can be easily manipulated to show the behavior of the induced noise in response to changes in the basic parameters.

Figure 3:
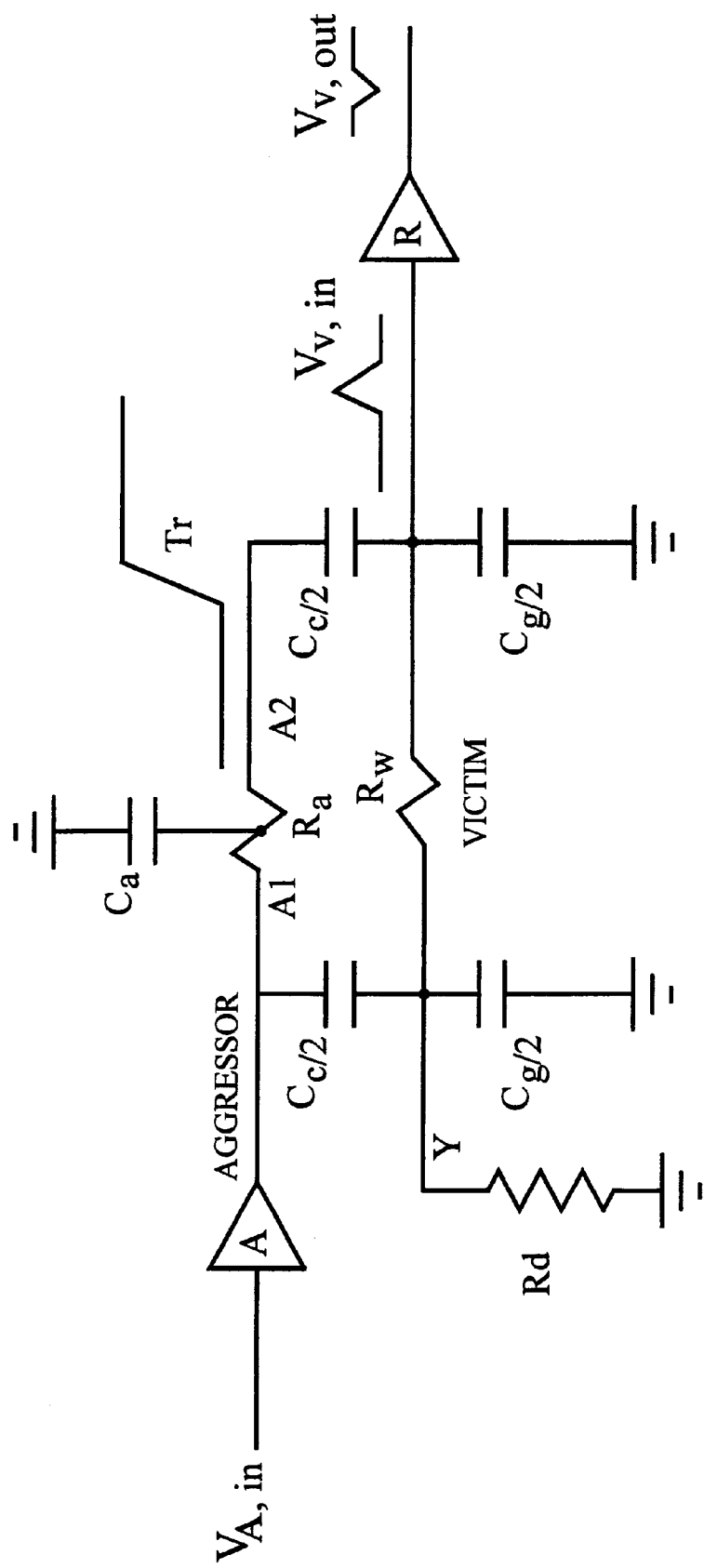
FIG. 3 is a schematic view of a circuit used for modeling response of a victim circuit to noise produced in an aggressor circuit.

A simplified circuit model, shown in FIG. 3, is used to model the crosstalk. The victim line is modeled as a one pi segment RC circuit. The capacitance to ground, $C_g$, and the coupling capacitance, $C_c$, are each lumped equally and placed at the beginning and at end of the resistance. An inherent assumption of this model, which makes the analysis considerably simpler, is that the coupling capacitance and ground capacitance are uniformly distributed throughout the line. The victim line is assumed to be holding its signal value by way of a transistor or group of transistors, all operating in the linear region. As shown in FIG. 3, this transistor group is modeled as a single linear resistance, $R_d$ of the group, with the resistance value being determined by the device geometries. For the aggressor signal A, the model assumes a ramp signal with a fixed slope, $V_{dd}/T_r$, that is rising or falling from $t=0$ to $t=T_r$. If the resistance $R_a$ is assumed to be zero, the rise time, $T_r$, is the same over every part of the line. The rise time $T_r$ can be estimated from the circuit parameters on the aggressor line. For the purpose of this analysis, a rising aggressor signal A is assumed.

The rise time of an aggressor signal A may be estimated based on the switching resistance of the transistors driving that line, the total capacitive load and the wire resistance of that line, where the resistance $R_a$ is now factored into the calculation of rise time $T_r$. This calculated rise time should be an effective rise time for the wire, because by superposition all the aggressor signals are lumped together in the model, with an equivalent rise time for the lumped line. This equivalent rise time, $T_r(equiv)$, is a weighted harmonic mean of the individual rise times of all the aggressors attacking the victim line, and is given by $$1/T_r(equiv) = \sum_{i=1}^{N} \{f_c(i)/T_r(i)\} / \sum_{j=1}^{N} f_c(j), \quad (1)$$

where the weighting factor $f_c(i)$ is the capacitive coupling from the ith aggressor to the victim and N is the total number of aggressors.

Once the shape of the noise pulse is known, one needs a criterion for determining if this noise pulse could cause a failure. The criterion for failure depends not only on the noise pulse, but also on the characteristics of the gate that receives this pulse as an input signal. This criterion should ensure that the amount of noise voltage propagated through the receiving gate is below a certain level, $V_{N,prop,max}$, with a margin for ground bounce and other effects not yet accounted for. When a gate output signal due to noise exceeds this threshold value, $V_{N,prop,max}$, this condition is termed a noise failure. The threshold value $V_{N,prop,max}$ may be defined in two ways, according to the type of noise propagation one is trying to eliminate. Amplified propagation corresponds to a situation where the noise propagated by the gate is more than the input noise signal received by the gate. In order to eliminate amplified propagation, a necessary condition is that the output voltage signal be less than the noise propagation threshold voltage:

$$\max\{V_{V,out}(t)\} < V_{N,prop,max} = \max\{V_{A,in}(t)\} - (\text{margin}), \quad (2)$$

where $V_{A,in}(t)$ and $V_{V,out}(t)$ are the aggressor input signal and the victim output signal, respectively.

By restricting the input noise pulse voltage $V_{A,in}(t)$ to be small enough so that the receiving gate is not pushed into the greater-than-unity gain region of operation, one can eliminate amplified propagation. For most symmetric static gates, this would correspond to an input voltage equal to the unity gain voltage in the dynamic transfer characteristic of the receiving gate. Alternatively, for dynamic gates where the gain in one direction is much higher than the gain in the reverse direction, the discharge current is a function of the square of the gate output voltage, $\{V_{V,out}\}^2$. Therefore, the amount of charge discharged by a MOSFET in the evaluate stack due to an input noise pulse is proportional to the energy of the pulse, to a first order approximation. Limiting this pulse energy to no more than a threshold value ensures that amplified propagation does not occur. Pulse propagation is taken to correspond to a situation where the input noise received at a gate causes a pulse at the output with a height greater than a small fraction $\chi$ of the rail voltage ($0<\chi\leq 1$; preferably, $0<\chi\leq 0.2$). For eliminating pulse propagation, the required condition is:

$$\max\{V_{V,out}\} < V_{N,prop,max} = \chi V_{dd}. \quad (3)$$

Again, by bounding the input noise pulse voltage magnitude to be less than a limit that can be determined by simulation for each gate, one can prevent pulse propagation. When the propagation of noise through a gate is discussed herein, this refers to mean pulse propagation as defined above. Eliminating pulse propagation also removes amplified propagation for all practical gates.

Once the threshold voltage $V_{N,prop,max}$ has been determined for a project, this threshold must be translated into corresponding limits on the input noise pulse voltage for every gate in the design. An excessive amplitude for the noise pulse input signal could push the gate into a region close to or beyond its trip point, where the gain of the gate causes the output voltage to exceed the threshold value $V_{N,prop,max}$. By limiting the input noise pulse voltage received by the gate to below a certain value, one can ensure that at least one of the conditions (2) or (3) is met. The first criteria for avoiding failure on the input noise pulse $V_{A,in}(t)$ is $$\max\{V_{A,in}(t)\} < V_{N,max}, \quad (4)$$

where $V_{N,max}$ is an amplitude limit chosen so that the output voltage does not exceed $V_{N,prop,max}$. The voltage limit $V_{N,max}$ is determined by simulation for a given gate.

During a noise-induced discharge, a MOSFET is in the saturated region of operation, and the amount of current the MOSFET conducts is, to first order, proportional to the square of the difference between the input gate voltage and the gate threshold voltage. Thus, the energy of a noise pulse corresponds loosely to the total charge discharged by a MOSFET that receives the noise pulse. If the input noise pulse energy exceeds a certain level, it is possible that the amount of charge discharged at the output terminal reduces the output voltage to a level that exceeds the threshold voltage $V_{N,prop,max}$. Thus, the energy limit, $E_{N,max}$, for a gate should satisfy $$\int\{V_{V,out}(t)-V_{thr}\}^2 dt < E_{N,max}\cdot\Delta t(\text{noise}) \quad (5)$$

where $\Delta t(\text{noise})$ is a time interval having the duration of a representative noise pulse and $V_{thr}$ is the receiving NMOS threshold voltage. Setting the limits $V_{N,max}$ and $E_{N,max}$ on the input noise pulse voltage and energy removes the need to model and analyze the receiving gate and measure the amount of noise propagated to $V_{out}$ in order to apply criteria (2) or (3). The criterion given in (4) correlates well with failures in circuits with complementary stacks and approximately equal gain for the rising and falling transitions. However, the energy based criterion in (5) correlates better with failures in dynamic circuits that have an asymmetric gain and a high threshold voltage sensitivity.

As an alternative to simulation, the bounds $E_{N,max}$ and $V_{N,max}$ can also be calculated from the transistor models, gate structure and loading information. Further, one may take advantage of the fact that these numbers will not change dramatically across families of gates, and typical values for $E_{N,max}$ and $V_{N,max}$ may be predetermined for different classes of gates. The problem is then reduced to one of identifying the different types of gates and applying the predetermined criteria, similar to checking for a required setup time for a given circuit during a timing analysis. A disadvantage of such a lookup-based approach is that the values of $V_{N,max}$ and $E_{N,max}$ are technology dependent, and require recharacterization when moving across processes. However, in practice, these values would form a small part of the number of simulations required for a process change.

The analysis described in the preceding may be conducted using a flat transistor level netlist of the circuit under test. However, such an analysis could prove unwieldy for a large design with millions of transistors, due to the size of the extracted netlists involved and the run times required for generating and analyzing them. A closer look at the circuit models presented in connection with FIGS. 2A and 2B reveals that the driver element resistance, denoted by $R_d$, need not be a transistor. At a higher level, this resistance source could be viewed as a gate. A characteristic switching resistance is generally measured during timing characterization and is already available for all gates used in the design. Thus, the driver resistance value $R_d$ can easily be derived for any gate from the characterization data already available.

Similarly, for the receiving gate, capacitive loading information can be obtained from characterized libraries. The other parameters that are needed for the analysis can be obtained as before from a hierarchical layout extracted netlist where a gate is treated as a "black box" with a characteristic output resistance and input capacitance. At this point, a hierarchical noise analysis may be conducted at an inter-gate level, as opposed to a flat inter-transistor level. Abstracting the circuits even further, an entire block of gates (including datapaths, memories and control blocks) could be analyzed as a black box, and the extraction and noise analysis can be run on a top level chip. The internal nodes of the black box will not be visible to the hierarchical analysis, and these nodes will have to be dealt with by a transistor level analysis on the block itself. Such a hierarchical approach allows a noise analysis to be performed on arbitrarily large blocks by splitting them into manageable levels of hierarchy.

A hierarchical analysis at a very coarse level would result in some inaccuracy, due to the fact that noise injected into a higher level of hierarchy from a lower level may not be taken into account. Smart extraction tools that perform a "gray box" extraction, where wiring information inside the hierarchy boxes is also extracted, can help reduce this inaccuracy. The opposite effect of a lower level being affected by routing in a higher level can be accounted for by a "cookie cutter" extraction, where the top level routing is captured on top of a lower level block when the lower level block is extracted. If such tools are not available, keeping the size of the hierarchy box as small as possible reduces the inaccuracy, while making the boxes bigger and bigger reduces the complexity and run time. Table 3 compares the noise levels as measured by a gate level hierarchical analysis and flat file analysis. It can be seen that the loss of accuracy in going from fully flat to gate level is very small.

The assumption that all aggressor signals (noise signal sources) on a given line are firing simultaneously and in the same direction is inherent in a lumping of all aggressor signals into a single aggressor signal, as has been done by other workers. This assumption is unduly pessimistic in many situations. For a given set of aggressors, some signals may be logically exclusive of other signals or may be unable to switch in the same direction at the same time. Several signals may be based on timing information and may switch at distinct points in a clock cycle.

Logical exclusivity of signals may be imposed by the circuit designer or analyst, and may be further analyzed to determine the "worst" aggressor signal, according to some criterion, in any given set of mutually exclusive set of noise sources. This worst case aggressor signal, after it is identified, is then combined with other non-exclusive aggressor signals in the circuit to produce an effective lumped aggressor signal that represents a realistic worst case response. Part or all of the residual aggressor signals that are mutually exclusive relative to the worst case aggressor signal are then assumed to be quiet and to contribute nothing to the coupling.

Figure 4:
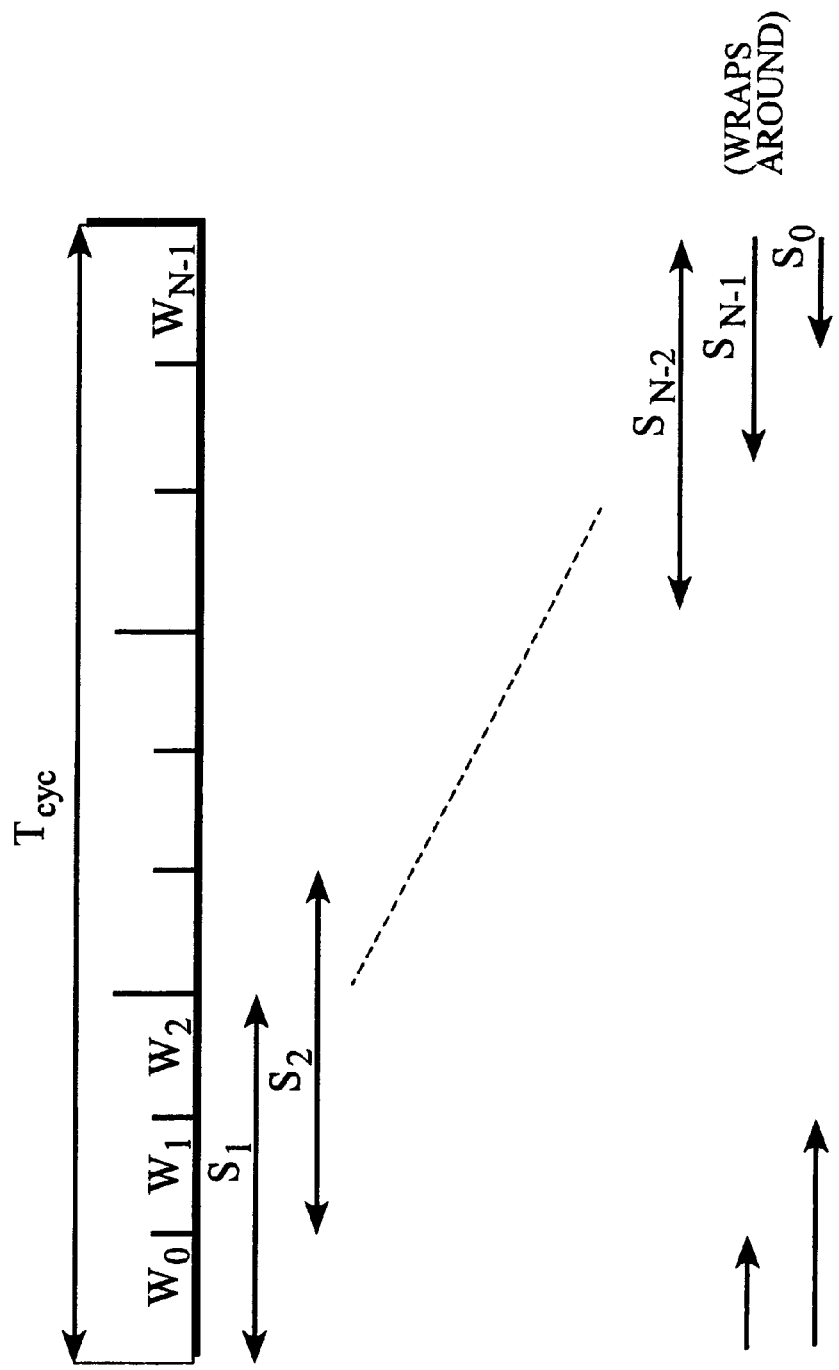
FIG. 4 illustrates timing windows and switching intervals used in analyzing the invention.
Figure 6:
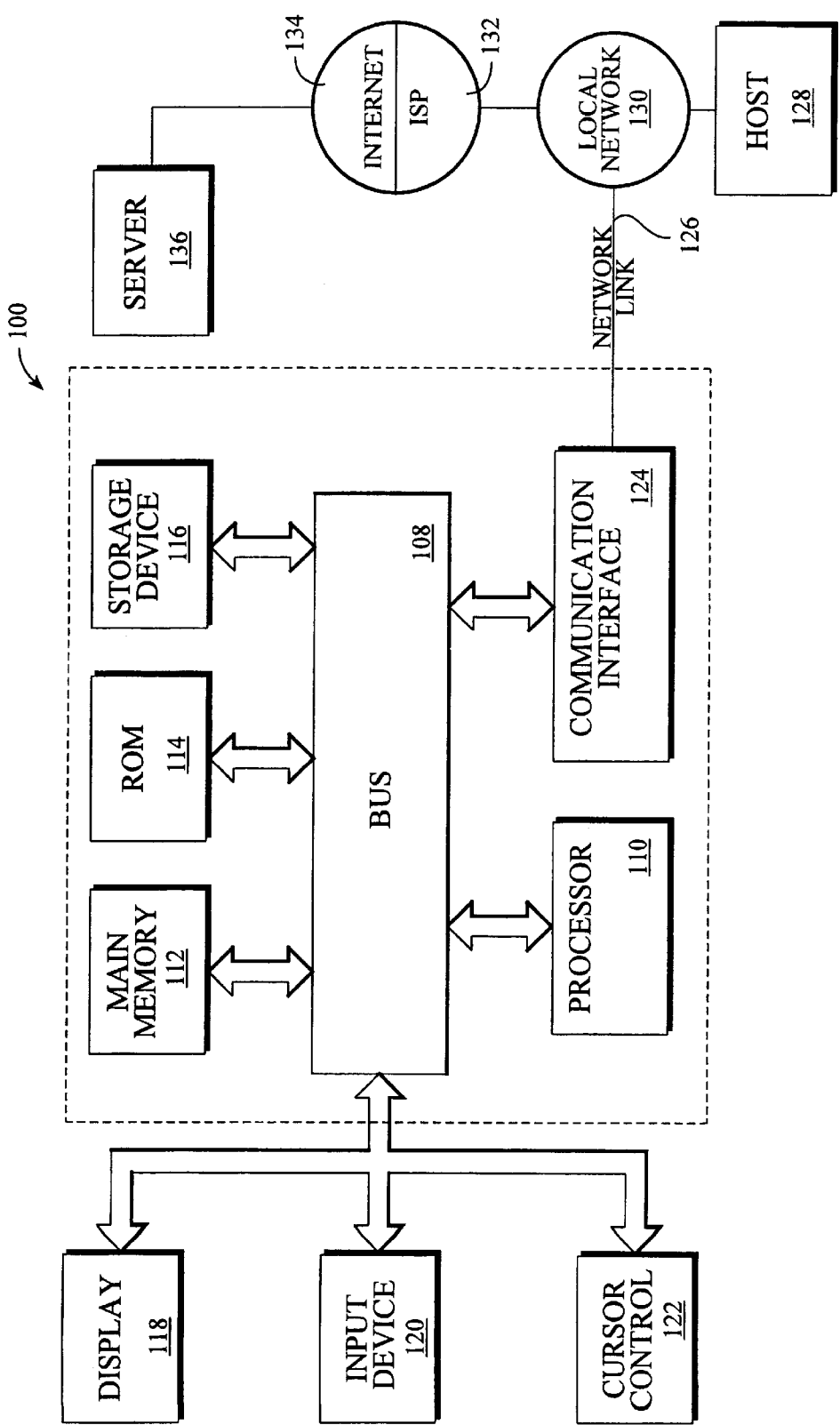

Temporal exclusivity is accounted for by defining for each signal a timing window, within which the associated signal can switch. As illustrated in FIG. 4, a clock cycle time $T_{cyc}$ is divided into N overlapping timing windows (N≧2), labeled $W_0, W_1, \ldots W_{N-1}$, (repeated through wraparound) which have approximately equal window widths $\Delta w$. A switching interval, $S_r$ (r=0, 1, ..., N−1), consists of the union of three contiguous windows $W_{(r-1)(mod\ N)} \cup W_{r(mod\ N)} \cup W_{(r+1)(mod\ N)}$. Each switching interval $S_r$ overlaps two adjacent switching intervals, $S_{r-1}$ and $S_{r+1}$. Noise analysis, performed within each switching interval $S_r$, has the effect of spreading the signal and signal switching associated with a window $W_r$ to the two adjacent windows. This spreading of the signal switching time is done to account for the fact that a signal begins to switch when it moves away from its preceding value (0%) toward another discrete value (100%). This spreading also compensates for uncertainties in signal arrival timing, $\Delta t(timing)$, and clock skew, $\Delta t(skew)$. A preferred estimate for the switching interval size, $\Delta t(interval)$, for each of the switching intervals $S_0$ through $S_{N-1}$ would be $$\Delta t(\text{interval}) = \Delta t(\text{pulse}) + \Delta t(\text{arrival}) + \Delta t(\text{skew}), \tag{6}$$

where $\Delta t(pulse)$ is the time required for a signal to switch from 10 percent to 90 percent of the difference of the signal values before switching begins and after switching is completed.

As indicated in FIG. 4, these switching intervals $W_r$ wrap around so that, for example, a switching signal in the window $W_{N-1}$ would be spread to the next-occurring window $W_0$ and a switching signal in an window $W_0$ would be spread to the preceding window $W_{N-1}$. This assumes that sufficient timing information is available to place most or all of a switching signal into a single interval $W_r$. If no timing information is available, the switching signal would be placed in all intervals $W_r$; and a relatively inactive signal, such as reset or scan_enable, might be placed in none of the intervals. Presence of frequency independent noise is thus potentially the most damaging or disruptive.

Once all scheduled signals are placed in the appropriate windows and switching intervals, a noise analysis is performed for each switching interval $S_r$, using only those signals that may switch in that switching interval as aggressor signals that switch at the "same time". The noise level in the worst case interval is reported as an estimate of noise on the line.

The number, N, of switching intervals to be used is determined by the size of $\Delta t(interval)$ and by the number, M, of windows per switching interval. The number M=3 is a suitable choice, but the invention is not limited to this choice; any number M≧2 may be used here, with appropriate changes. The clock skew, $\Delta t(skew)$, is expected to have little variability, and the maximum pulse width and the timing uncertainty term, $\Delta t(timing)$, will primarily determine the size of the switching interval used. Use of a relatively large value for N results in less pessimism in the noise analysis; use of a relatively small value for N provides more tolerance for timing uncertainties. The number N should be at least 4; choice of N≦3 will produce a switching interval that is the full switching cycle. Choices N=6, 7 or 8 are straightforward to implement; use of a smaller value for N (N=4 or 5) may not be possible. With the choice N=6, the number of noise violations reported on a test datapath using the invention, is reduced by about 70 percent from the number of noise violations in a conventional approach, where no timing information is accounted for.

A noise analysis software tool ("noisetool") has been developed, using the model discussed in the preceding, to detect large coupling noise voltages that are induced in a microprocessor chip and to allow practice of the invention. In one version, the third noise detection approach discussed in the preceding is used: a noise pulse should not propagate through an amplifying stage, and all noise induced at any site on a net should be induced only by aggressor signals at nearest neighbor sites, not by any preceding logic stages.

The noisetool uses a layout parasitic extracted netlist as a starting point and is capable of performing flat file and hierarchical analyses. All interconnect parasitic elements, such as the capacitive and resistive elements $C_c$ and $R_w$ (shown in FIG. 3) are read from this netlist. In a flat file analysis, the gate and diffusion capacitances of the transistors are calculated based on the transistor models and transistor sizing information contained in the netlist. Because a bias-independent linear resistance is assumed for the transistor associated with the "victim" line, this resistance is computed based on the device parameters. When a hierarchical analysis is performed, the capacitive loading and/or drive resistance of the sub-circuit ports are preferably obtained from characterized data files.

After the data are read from the netlist, a circuit model, such as that shown in FIG. 3, is constructed within the noisetool, and a solution is determined, which may resemble the solution in (1A) and (1B). Failure criteria, as discussed in the preceding, are applied for each net, using precharacterized values of $V_{N,max}$ and $E_{N,max}$ that prevent pulse propagation as defined in the preceding. Detailed circuit simulation using SPICE indicates that the criterion set forth in the relation (7) correlates much better than the relation (8) with failures observed in simulations. Preferably, all quantitative results use the criterion set forth in (7), rather than a criterion such as (8). However, the criterion (8) can be used in appropriate instances. A failing net is flagged and reported as a violation, along with the calculated maximum noise voltage and other parameters of concern.

A normalized noise level (peak induced noise voltage, expressed as a fraction of the value $V_{dd}$) reported by the noisetool is compared with the corresponding SPICE results on at least two types of circuits. A first category of comparisons is on test circuits, where some of the assumptions incorporated in the noisetool are constrained to be true. Comparisons in this first category are made on lines that have uniformly distributed coupling, no branches, and two major aggressor signals that are similarly uniform; all aggressor signals are assumed to switch at the same time. These examples predict a peak noise voltage value in the range 20–40 percent of $V_{dd}$; this is the range where most failures are likely to occur. Results of this comparison for a 0.25 µm technology are presented in Table 1.

Comparisons in a second category are run on actual blocks taken from the Sun UltraSPARC III design. The results for a regular datapath structure, a synthesized control block and for the core of the chip are presented in Table 2. The peak noise calculated on nets is pessimistic by an average of about 20 percent. In the floating point datapath, where the wiring is reasonably regular and non-branching, the average error is lower than the error in the random control block. Also, the calculation of the aggressor rise time ($T_r$ in FIG. 2A) is pessimistic by about 30 percent on average and by 66 percent in the worst case. This discrepancy is the largest contributor to the inaccuracy in peak noise. A better method of calculating the aggressor slew rate, especially for aggressors with non-uniform loading and multiple branches, would improve the accuracy of the noise-tool.

FIG. 5 shows a block diagram of a general computer system 100, which may be used to implement various hardware components of the invention, such as a client an applications server and a database management system. The computer system 100 includes a bus 108 or other communication mechanism for communicating information and a processor 110, coupled with the bus 108, for processing information. The computer system 100 also includes a main memory 112, such as a random access memory (RAM) or other dynamic storage device, coupled to the bus 108, for storing information and instructions to be executed by the processor 110. The main memory 112 also may be used for storing temporary variables or other intermediate information during execution of instructions by the processor 110. The computer system 100 further optionally includes read only memory (ROM) 114 or other static storage device, coupled to the bus 108, for storing static information and instructions for the processor 110. A storage device 116, such as a magnetic disk or optical disk, is provided and is coupled to the bus 108 for storing information and instructions.

The computer system 100 may also be coupled through the bus to a display 118, such as a cathode ray tube (CRT), for displaying information to a computer user. An input device 120, including alphanumeric and other keys, is coupled to the bus for communicating information and commands to the processor 110. Another type of user input device is a cursor control 122, such as a mouse, a trackball or cursor direction keys for communicating direction information and command selections to the processor 110 and for controlling cursor movement on the display 118. This input device typically has one degree of freedom in each of two axes, such as x- and y-axes, that allows the device to specify locations in a plane.

The functionality of the invention is provided by the computer system 100 in response to the processor 110 executing one or more sequences of instructions contained in main memory 112. These instructions may be read into main memory 112 from another computer-readable medium, such as a storage device 116. Execution of the sequences of instructions contained in the main memory 112 causes the processor 110 to perform the process steps described herein.

In alternative embodiments, hard-wired circuitry may be used in place of, or in combination with, software instructions to implement the invention. Embodiments of the invention are not limited to any specific combination of hard-wired circuitry and software.

The term "computer-readable medium", as used herein, refers to any medium that participates in providing instructions to the processor 110 for execution. This medium may take many forms, including but not limited to non-volatile media, volatile media and transmission media. Non-volatile media includes, for example, optical and magnetic disks, such as the storage disks 116. Volatile media includes dynamic memory 112. Transmission media includes coaxial cables, copper wire and fiber optics and includes the wires that are part of the bus 108. Transmission media can also take the form of acoustic or electromagnetic waves, such as those generated during radiowave, infrared and optical data communications.

Common forms of computer-readable media include, for example, a floppy disk, a flexible disk, a hard disk, magnetic tape or any other magnetic medium, a CD-ROM, any other optical medium, punchcards, papertape, any other physical medium with patterns of holes or apertures, a RAM, a ROM, a PROM, an EPROM, a Flash-EPROM, any other memory chip or cartridge, a carrier wave as described hereinafter, or any other medium from which a computer can be read.

Various forms of computer-readable media may be involved in carrying out one or more sequences of one or more instructions to the processor 110 for execution. For example, the instructions may initially be carried on a magnetic disk of a remote computer. The remote computer can load the instructions into its dynamic memory and send the instructions over a telephone, using a modem. A modem local to the computer system 100 can receive data over a telephone line and use infrared transmitter to convert and transmit the data to the an infrared detector connected to the computer system bus. The bus will carry the data to the main memory 112, from which the processor receives and executes the instructions. Optionally, the instructions receive by the main memory 112 can be stored on the storage device 116, either before or after execution by the processor 110.

The computer system 100 also includes a communications interface 124, coupled to the bus 108, which provides two-way data communication coupling to a network link 126 that is connected to a local area network (LAN) or to a wide area network (WAN). For example, the communications interface 124 may be an integrated services digital network (ISDN) card or a modem to provide a data communication connection to a corresponding type of telephone line. As another example, the communications interface 124 may be a local area network card to provide a data communication connection to a compatible LAN. Wireless links may also be implemented. In any such implementation, the communications interface 124 sends and receives electrical, electromagnetic or optical signals that carry digital data streams representing various types of information.

The network link 126 typically provides data communication through one or more networks to other data devices. For example, the data link 126 may provide a connection through an LAN 128 to a host computer 130 or to data equipment operated by an Internet Service Provider (ISP) 132. The ISP, in turn, provides data communication services through the world wide packet data communication network, now commonly known as the "Internet" 134, served by one or more servers 136. The LAN 128 and the Internet 134 both use electrical, electromagnetic and/or optical signals to carry the digital data streams. The signals carried by these network, the signals carried on the network link 126 and the signals carried on the communications interface 124, are examples of carrier waves that transport the information.

What is claimed is:

1. A method for detecting and analyzing effects of noise in a digital circuit, the method comprising:

providing M selected circuits, numbered m'=1, 2, ..., M, that are electrically connected together, each circuit having at least one semiconductor gate, where M≧2;

providing a wraparound sequence of N consecutive window intervals of selected temporal lengths, with N≧4, where each group of three consecutive window intervals, referred to as a window group interval, includes at least one of the following time intervals: an estimated time interval Δt(pulse) required for a second circuit to switch from within x1 percent of a second circuit initial voltage value to within x2 percent of a second circuit final voltage value, in response to switching of a first circuit, where x1 and x2 are selected numbers satisfying 0<xi≦100 (i=1, 2); an estimated time interval Δt(arrival) of uncertainty in arrival of a voltage input signal $V_{1,in}(t)$ at the at least one gate in the first circuit, and an estimated time interval Δt(skew) for uncertainty in accuracy in time provided by a clock signal used to synchronize time for at least one circuit;

introducing the voltage input signal, $V_{1,in}(t)$, into the first circuit within a selected window interval, allowing the at least one gate in the first circuit to switch from a first state to a second state within a selected window group interval, and estimating a time interval $TI_m$, beginning at the time the input signal $V_{1,in}(t)$ is introduced, within which at least one gate of a circuit numbered m=2, ..., M switches from a circuit m first state to a circuit m second state and produces a voltage output signal, denoted $V_{m,out}(t)$;

computing a combined voltage output signal $V_{c,out}(t)$ as a sum of the output voltage signals $V_{m,out}(t)$ (m=2, ..., M) for which the estimated time interval $TI_m$ lies within the selected window group interval;

determining whether the combined voltage output signal $V_{c,out}(t)$ satisfies at least one of first, second and third selected noise propagation criteria for the first circuit, namely $$\max\{V_{c,out}(t)\} \geq V_{N,prop,max,1} = \max\{V_{1,in}(t)\} - \{\text{margin}\}, \quad (1)$$

$$\max\{V_{c,out}(t)\} \geq V_{N,prop,max,c} = \chi \cdot V_{dd}, \quad (2)$$

and $$\int \{V_{c,out}(t) - V_{thr}\}^2 dt \geq E_{N,max} \Delta t(\text{noise}) \quad (3)$$

where {margin} is a selected margin voltage, χ is a selected fraction satisfying 0<χ<1, $V_{dd}$ is a maximum voltage supplied to at least one of the circuits, $V_{thr}$ is a selected threshold voltage and $E_{N,max}$ is a selected energy value; and when at least one gate in at least one circuit m=2, ..., M switches within the selected window group interval and the combined voltage output signal $V_{c,out}(t)$ satisfies at least one of the first, second and third noise propagation criteria for the first circuit, interpreting this response of the circuits m=2, ..., M as permitting noise provided at a gate in the first circuit to propagate through at least one gate in at least one of the circuits m=2, ..., M.

2. The method of claim 1, further comprising interpreting said response of said second circuit as noise propagation failure.

3. The method of claim 1, further comprising:

when said voltage output signal $V_{c,out}(t)$ satisfies at least one of said first, second and third noise propagation criteria for said first circuit, reducing said maximum voltage, $\max\{V_{1,in}(t)\}$ so that said voltage output signal $V_{c,out}(t)$ no longer satisfies any of said first, second and third noise propagation criteria for said first circuit.

4. The method of claim 1, further comprising ignoring said switching of said circuit numbered m'=2, 3, ..., M when said at least one gate in said circuit m' does not switch within said selected window group interval.

5. The method of claim 1, further comprising choosing said window group interval to include each of said estimated time interval Δt(pulse), said time interval Δt(arrival) and said rime interval Δt(skew).

6. The method of claim 1, further comprising choosing said selected fraction χ in the range 0<χ≦0.2.

7. The method of claim 1, further comprising choosing said integer N to be in the range 4≦N≦8.

8. A method for detecting and analyzing effects of noise in a digital circuit, the method comprising:

providing M selected circuits, numbered m'=1, 2, ..., M, that are electrically connected together, each circuit having at least one semiconductor gate, where M≧2;

providing a wraparound sequence of N consecutive window intervals of selected temporal lengths, with N≧4, where each group of three consecutive window intervals, referred to as a window group interval, includes the following time intervals: an estimated time interval Δt(pulse) required for a second circuit to switch from within x1 percent of a second circuit initial voltage value to within x2 percent of a second circuit final voltage value, in response to switching of a first circuit, where x1 and x2 are selected numbers satisfying 0<xi≦100 (i=1, 2); an estimated time interval Δt(arrival) of uncertainty in arrival of a voltage input signal $V_{1,in}(t)$ at the at least one gate in the first circuit, and an estimated time interval Δt(skew) for uncertainty in accuracy in time provided by a clock signal used to synchronize time for at least one circuit;

introducing the voltage input signal, $V_{1,in}(t)$, into the first circuit, within a selected window interval, allowing the at least one gate in the first circuit to switch from a first state to a second state within a selected window group interval, and estimating a time interval $TI_m$, beginning at the time the input signal $V_{1,in}(t)$ is introduced, within which at least one gate of a circuit numbered m=2, ..., M switches from a circuit m first state to a circuit m second state and produces a voltage output signal, denoted $V_{m,out}(t)$;

computing a combined voltage output signal Vc,out(t) as a sum of the output voltage signals $V_{m,out}(t)$ (m=2, ..., M) for which the estimated time interval $TI_m$ lies within for which at least one circuit m=2, ..., M switches from a first state to a second state lies within the selected window group interval, to form a combined voltage output signal $V_{c,out}(t)$;

determining whether the combined voltage output signal $V_{c,out}(t)$ satisfies at least one of first, second and third selected noise propagation criteria for the first circuit, namely $$\max\{V_{c,out}(t)\} \geq V_{N,prop,max,1} = \max\{V_{1,in}(t)\} - \{\text{margin}\}, \quad (1)$$

$$\max\{V_{c,out}(t)\} \geq V_{N,prop,max,c} = \chi \cdot V_{dd}, \quad (2)$$

and $$\int \{V_{c,out}(t) - V_{thr}\}^2 dt \geq E_{N,max} \Delta t(\text{noise}) \quad (3)$$

where {margin} is a selected margin voltage, χ is a selected fraction satisfying 0<χ<1, $V_{dd}$ is a maximum voltage supplied to at least one of the first and second circuits, $V_{thr}$ is a selected threshold voltage and $E_{N,max}$ is a selected energy value; and when the at least one gate in the second circuit switches within the selected window group interval and the combined voltage output signal $V_{c,out}(t)$ satisfies at least one of the first, second and third noise propagation criteria for the first circuit, interpreting this response of the second circuit as permitting noise provided at a gate in the first circuit to propagate through at least one gate in the second circuit.

9. The method of claim 8, further comprising interpreting said response of said second circuit as noise propagation failure.

10. The method of claim 8, further comprising:

when said voltage output signal $V_{c,out}(t)$ satisfies at least one of said first, second and third noise propagation criteria for said first circuit, reducing said maximum voltage, $\max\{V_{1,in}(t)\}$ so that said voltage output signal $V_{c,out}(t)$ no longer satisfies any of said first, second and third noise propagation criteria for said first circuit.

11. The method of claim 8, further comprising ignoring said switching of said circuit numbered m'=2, 3, ..., M when said at least one gate in said circuit m' does not switch within said selected window group interval.

12. The method of claim 8, further comprising choosing said window group interval to include each of said estimated time interval Δt(pulse), said time interval Δt(arrival) and said rime interval Δt(skew).

13. The method of claim 8, further comprising choosing said selected fraction $\chi$ in the range $0<\chi\leq 0.2$.

14. The method of claim 8, further comprising choosing said integer N to be in the range $4\leq N\leq 8$.

15. A system for detecting and analyzing effects of noise in a digital circuit, the system comprising a computer that is programmed:

to provide a representation for M selected circuits, numbered m'=1, 2, ..., M, that are electrically connected together, each circuit having at least one semiconductor gate, where M is a selected integer that is at least two;

to provide a wraparound sequence of N consecutive window intervals of selected temporal lengths, with $N\geq 4$, where each group of three consecutive window intervals, referred to as a window group interval, includes at least one of the following time intervals: an estimated time interval Δt(pulse) required for a second circuit to switch from within x1 percent of a second circuit initial voltage value to within x2 percent of a second circuit final voltage value, in response to switching of a first circuit, where x1 and x2 are selected numbers satisfying $0<xi\leq 100$ (i=1, 2); an estimated time interval Δt(arrival) of uncertainty in arrival of a voltage input signal $V_{1,in}(t)$ at the at least one gate in the first circuit, and an estimated time interval Δt(skew) for uncertainty in accuracy in time provided by a clock signal used to synchronize time for at least one circuit;

to simulate introduction the voltage input signal, $V_{1,in}(t)$, into the first circuit within a selected window interval, to allow the at least one gate in the first circuit to switch from a first state to a second state within a selected window group interval, and to estimate a time interval $TI_m$, beginning at the time the input signal $V_{1,in}(t)$ is introduced, within which at least one gate of a circuit numbered m=2, ..., M switches from a circuit m first state to a circuit m second state and produces a voltage output signal, denoted $V_{m,out}(t)$;

to add the output voltage signals $V_{m,out}(t)$ (m=2, ..., M) for which the estimated time for which at least one circuit m=2, ..., M switches from a first state to a second state lies within the selected window group interval, to form a combined voltage output signal $V_{c,out}(t)$;

to determine whether the combined voltage output signal $V_{c,out}(t)$ satisfies at least one of first, second and third selected noise propagation criteria for the first circuit, namely $$\max\{V_{c,out}(t)\}\geq V_{N,prop,max,1}=\max\{V_{1,in}(t)\}-\{\text{margin}\}, \qquad (1)$$

$$\max\{V_{c,out}(t)\}\geq V_{N,prop,max,c}=\chi\cdot V_{dd}, \qquad (2)$$

and $$\int\{V_{c,out}(t)-V_{thr}\}^2 dt\geq E_{N,max}\cdot \Delta t(\text{noise}) \qquad (3)$$

where {margin} is a selected margin voltage, $\chi$ is a selected fraction satisfying $0<\chi<1$, $V_{dd}$ is a maximum voltage supplied to at least one of the first and second circuits, $V_{thr}$ is a selected threshold voltage and $E_{N,max}$ is a selected energy value; and when the at least one gate in the second circuit switches within the selected window group interval and the combined voltage output signal $V_{c,out}(t)$ satisfies at least one of the first, second and third noise propagation criteria for the first circuit, to interpret this response of the second circuit as permitting noise provided at a gate in the first circuit to propagate through at least one gate in the second circuit.

16. The system of claim 15, wherein said computer is further programmed to interpret said response of said second circuit as noise propagation failure.

17. The system of claim 15, wherein said computer is further programmed so that:

when said voltage output signal $V_{c,out}(t)$ satisfies at least one of said first, second and third noise propagation criteria for said first circuit, to reduce said maximum voltage, $\max\{V_{1,in}(t)\}$ so that said voltage output signal $V_{c,out}(t)$ no longer satisfies any of said first, second and third noise propagation criteria for said first circuit.

18. The system of claim 15, wherein said computer is further programmed to ignore said switching of said circuit numbered m'=2, 3, ..., M when said at least one gate in said circuit m' does not switch within said selected window group interval.

19. The system of claim 15, wherein said computer is further programmed to choose said window group interval to include each of said estimated time interval Δt(pulse), said time interval Δt(arrival) and said rime interval Δt(skew).

20. The system of claim 15, wherein said computer is further programmed to choose said selected fraction $\chi$ in the range $0<\chi\leq 0.2$.

21. The system of claim 15, wherein said computer is further programmed to choose said integer N to be in the range $4\leq N\leq 8$.

22. A system for detecting and analyzing effects of noise in a digital circuit, the system comprising a computer that is programmed:

to provide a representation for M selected circuits, numbered m'=1, 2, ..., M, that are electrically connected together, each circuit having at least one semiconductor gate, where M is a selected integer that is at least two;

to provide a wraparound sequence of N consecutive window intervals of selected temporal lengths, with $N\geq 4$, where each group of three consecutive window intervals, referred to as a window group interval, includes the following time intervals: an estimated time interval Δt(pulse) required for a second circuit to switch from within x1 percent of a second circuit initial voltage value to within x2 percent of a second circuit final voltage value, in response to switching of a first circuit, where x1 and x2 are selected numbers satisfying 0<xi≦100 (i=1, 2); an estimated time interval Δt(arrival) of uncertainty in arrival of a voltage input signal $V_{1,in}(t)$ at the at least one gate in the first circuit, and an estimated time interval Δt(skew) for uncertainty in accuracy in time provided by a clock signal used to synchronize time for at least one circuit;

to simulate introduction the voltage input signal, $V_{1,in}(t)$, into the first circuit within a selected window interval, to allow the at least one gate in the first circuit to switch from a first state to a second state within a selected window group interval, and to estimate a time interval $TI_m$, beginning at the time the input signal $V_{1,in}(t)$ is introduced, within which at least one gate of a circuit numbered m=2, . . . , M switches from a circuit m first state to a circuit m second state and produces a voltage output signal, denoted $V_{m,out}(t)$;

to add the output voltage signals $V_{m,out}(t)$ (m=2, . . . , M) for which the estimated time for which at least one circuit m=2, . . . , M switches from a first state to a second state lies within the selected window group interval, to form a combined voltage output signal $V_{c,out}(t)$;

to determine whether the combined voltage output signal $V_{c,out}(t)$ satisfies at least one of first, second and third selected noise propagation criteria for the first circuit, namely $$\max\{V_{c,out}(t)\} \geq V_{N,prop,max,1} = \max\{V_{1,in}(t)\} - \{margin\}, \quad (1)$$

$$\max\{V_{c,out}(t)\} \geq V_{N,prop,max,c} = \chi \cdot V_{dd}, \quad (2)$$

and $$\int \{V_{c,out}(t) - V_{thr}\}^2 dt \geq E_{N,max} \Delta t(noise) \quad (3)$$

where {margin} is a selected margin voltage, χ is a selected fraction satisfying 0<χ<1, $V_{dd}$ is a maximum voltage supplied to at least one of the first and second circuits, $V_{thr}$ is a selected threshold voltage and $E_{N,max}$ is a selected energy value; and when the at least one gate in the second circuit switches within the selected window group interval and the combined voltage output signal $V_{c,out}(t)$ satisfies at least one of the first, second and third noise propagation criteria for the first circuit, to interpret this response of the second circuit as permitting noise provided at a gate in the first circuit to propagate through at least one gate in the second circuit.

23. The system of claim 22, wherein said computer is further programmed to interpret said response of said second circuit as noise propagation failure.

24. The system of claim 22, wherein said computer is further programmed so that:

when said voltage output signal $V_{c,out}(t)$ satisfies at least one of said first, second and third noise propagation criteria for said first circuit, to reduce said maximum voltage, max$\{V_{1,in}(t)\}$ so that said voltage output signal $V_{c,out}(t)$ no longer satisfies any of said first, second and third noise propagation criteria for said first circuit.

25. The system of claim 22, wherein said computer is further programmed to ignore said switching of said circuit numbered m'=2, 3, . . . , M when said at least one gate in said circuit m' does not switch within said selected window group interval.

26. The system of claim 22, wherein said computer is further programmed to choose said window group interval to include each of said estimated time interval Δt(pulse), said time interval Δt(arrival) and said rime interval Δt(skew).

27. The system of claim 22, wherein said computer is further programmed to choose said selected fraction χ in the range 0<χ≦0.2.

28. The system of claim 22, wherein said computer is further programmed to choose said integer N to be in the range 4≦N≦8.

29. An article of manufacture comprising:

a computer usable medium having computer readable code means embodied therein for representing M selected circuits, numbered m'=1, 2, . . . , M, that are electrically connected together, each circuit having at least one semiconductor gate, where M is a selected integer that is at least two;

computer readable program code means for providing a wraparound sequence of N consecutive window intervals of selected temporal lengths, with N≧4, where each group of three consecutive window intervals, referred to as a window group interval, includes at least one of the following time intervals: an estimated time interval Δt(pulse) required for a second circuit to switch from within x1 percent of a second circuit initial voltage value to within x2 percent of a second circuit final voltage value, in response to switching of a first circuit, where x1 and x2 are selected numbers satisfying 0<xi≦100 (i=1, 2); an estimated time interval Δt(arrival) of uncertainty in arrival of a voltage input signal $V_{1,in}(t)$ at the at least one gate in the first circuit, and an estimated time interval Δt(skew) for uncertainty in accuracy in time provided by a clock signal used to synchronize time for at least one circuit;

computer readable program code means for representing introduction of the voltage input signal, $V_{1,in}(t)$, into the first circuit within a selected window interval, for allowing the at least one gate in the first circuit to switch from a first state to a second state within a selected window group interval, and for estimating a time interval $TI_m$, beginning at the time the input signal $V_{1,in}(t)$ is introduced, within which at least one gate of a circuit numbered m=2, . . . , M switches from a circuit m first state to a circuit m second state and produces a voltage output signal, denoted $V_{m,out}(t)$;

computer readable program code means for adding the output voltage signals $V_{m,out}(t)$ (m=2, . . . , M) for which the estimated time for which at least one circuit m=2, . . . , M switches from a first state to a second state lies within the selected window group interval, to form a combined voltage output signal $V_{c,out}(t)$;

computer readable program code means for determining whether the combined voltage output signal $V_{c,out}(t)$ satisfies at least one of first, second and third selected noise propagation criteria for the first circuit, namely $$\max\{V_{c,out}(t)\} \geq V_{N,prop,max,1} = \max\{V_{1,in}(t)\} - \{margin\}, \quad (1)$$

$$\max\{V_{c,out}(t)\} \geq V_{N,prop,max,c} = \chi \cdot V_{dd}, \quad (2)$$

and $$\int \{V_{c,out}(t) - V_{thr}\}^2 dt \geq E_{N,max} \Delta t(noise) \quad (3)$$

where {margin} is a selected margin voltage, χ is a selected fraction satisfying 0<χ<1, $V_{dd}$ is a maximum voltage supplied to at least one of the first and second circuits, $V_{thr}$ is a selected threshold voltage and $E_{N,max}$ is a selected energy value; and computer readable program code means for interpreting a selected response of the second circuit as permitting noise provided at a gate in the first circuit to propagate through at least one gate in the second circuit, when the at least one gate in the second circuit switches within the selected window group interval and the combined voltage output signal $V_{c,out}(t)$ satisfies at least one of the first, second and third noise propagation criteria for the first circuit.

30. The article of claim 29, further comprising computer readable program code means for interpreting said response of said second circuit as noise propagation failure.

31. The article of claim 29, further comprising computer readable program code means for reducing said maximum voltage, $\max\{V_{1,in}(t)\}$ so that said voltage output signal $V_{c,out}(t)$ no longer satisfies any of said first, second and third noise propagation criteria for said first circuit, when said voltage output signal $V_{c,out}(t)$ satisfies at least one of said first, second and third noise propagation criteria for said first circuit.

32. The article of claim 29, further comprising computer readable program code means for ignoring said switching of said circuit numbered m'=2, 3, . . . , M when said at least one gate in said circuit m' does not switch within said selected window group interval.

33. The article of claim 29, further comprising computer readable program code means for choosing said window group interval to include each of said estimated time interval $\Delta t(pulse)$, said time interval $\Delta t(arrival)$ and said rime interval $\Delta t(skew)$.

34. The article of claim 29, further comprising computer readable program code means for choosing said selected fraction $\chi$ in the range $0 < \chi \leq 0.2$.

35. The article of claim 29, further comprising computer readable program code means for choosing said integer N to be in the range $4 \leq N \leq 8$.

* * * * *